United States Patent
Sasaki

(10) Patent No.: US 6,740,964 B2
(45) Date of Patent: May 25, 2004

(54) SEMICONDUCTOR PACKAGE FOR THREE-DIMENSIONAL MOUNTING, FABRICATION METHOD THEREOF, AND SEMICONDUCTOR DEVICE

(75) Inventor: Takaaki Sasaki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/942,962

(22) Filed: Aug. 31, 2001

(65) Prior Publication Data

US 2002/0060361 A1 May 23, 2002

(30) Foreign Application Priority Data

Nov. 17, 2000 (JP) .......................... 2000-351704

(51) Int. Cl.[7] .................... H01L 23/22; H01L 23/24
(52) U.S. Cl. ................ 257/687; 257/678; 257/684; 257/704; 257/729; 257/686; 257/787
(58) Field of Search ................ 438/598, 599; 257/773, 786, 687, 678, 684, 709, 724, 686, 787, 704

(56) References Cited

U.S. PATENT DOCUMENTS

| | | | |
|---|---|---|---|
| 5,726,493 A | * 3/1998 | Yamashita et al. | 257/698 |
| 6,348,728 B1 | * 2/2002 | Aiba et al. | 257/678 |
| 6,429,528 B1 | * 8/2002 | King et al. | 257/775 |
| 6,451,624 B1 | * 9/2002 | Farnworth et al. | 438/106 |

FOREIGN PATENT DOCUMENTS

| | | |
|---|---|---|
| JP | 07-335783 | 12/1995 |
| JP | 09-036273 | 2/1997 |
| JP | 09-069587 | 11/1997 |
| JP | 11-186492 | 7/1999 |
| JP | 2000-294720 | 10/2002 |

OTHER PUBLICATIONS

Lau, Flip Chip Technologies, 1996, McGraw–Hill, pp. 27–31, Figures 1.27, 1.29b.*

* cited by examiner

*Primary Examiner*—David A. Zarneke
(74) *Attorney, Agent, or Firm*—Rabin & Berdo, PC

(57) ABSTRACT

A semiconductor package for three-dimensional mounting is provided. The package includes a wiring substrate having a first surface on which a first wiring pattern is formed and a second surface on which a second wiring pattern is formed, the first wiring pattern and second wiring pattern being electrically connected to each other; a semiconductor chip placed on the first surface of the wiring substrate and electrically connected to the first wiring pattern; a sealing resin layer sealing the semiconductor chip and the first wiring pattern; a thickness direction wire passing through the sealing resin layer in a thickness direction and having one end electrically connected to the first wiring pattern and the other end exposed at the surface of the sealing resin layer; and a lower surface connecting electrode formed on the second surface of the wiring substrate and electrically connected to the second wiring pattern.

10 Claims, 8 Drawing Sheets

SEMICONDUCTOR PACKAGE FOR THREE-DIMENSIONAL MOUNTING, FABRICATION METHOD THEREOF, AND SEMICONDUCTOR DEVICE

BACKGROUND OF THE INVENTION

1. Field of the Invention

The present invention relates to a semiconductor package for three-dimensional mounting, a fabrication method thereof, and a semiconductor device. More specifically, the present invention relates to a semiconductor package for three-dimensional mounting which is easy to fabricate and has high packaging density, a fabrication method thereof, and a semiconductor device in which the semiconductor package for three-dimensional mounting is mounted onto a mother board.

2. Description of the Related Art

An example of a conventional BGA (i.e., ball grid array) type semiconductor package is illustrated in FIG. 15.

As illustrated in FIG. 15, a conventional BGA type semiconductor package includes a wiring substrate B and a semiconductor chip A placed on one surface of the wiring substrate B.

A first wiring pattern B2 is formed at the surface of the wiring substrate B on which the semiconductor chip A is placed, while a second wiring pattern B4 is formed at a surface of the wiring substrate B opposite the aforementioned surface. The first wiring pattern B2 and the second wiring pattern B4 are connected to each other via plated through holes B6 passing through the wiring substrate B.

The semiconductor chip A and the first wiring pattern B2 are connected to each other by wires D. A sealing resin layer C is formed at the surface of the wiring substrate B on which the semiconductor chip A is placed. The semiconductor chip A, the first wiring pattern B2, and the wires D are embedded in the sealing resin layer C.

On the other hand, the surface of the wiring substrate B on which the second wiring pattern B4 is provided is covered with a resist layer E formed by a photoresist resin. Openings E2 are provided at predetermined positions of the resist layer E, and the second wiring pattern B4 is exposed at the openings E2. Solder balls F are connected to the second wiring pattern B4 exposed at the openings E2.

When the above-described BGA type semiconductor package is mounted on a pad of a mother board via the solder balls F, a semiconductor circuit on the mother board is electrically connected to the semiconductor chip A via the pad, the solder balls F, the second wiring pattern B4, the plated through holes B6, the first wiring pattern B2, and the wires D.

However, the BGA type semiconductor packages are mounted onto a mother board only in a two-dimensional manner and cannot be stacked. Thus, there are limitations on the packaging density of the semiconductor packages which can be achieved on a mother board.

Use of small BGA type semiconductor packages can be considered as a means for increasing the packaging density of the BGA type semiconductor packages on the mother board. However, if the BGA type semiconductor packages are made compact, the pitch at which the solder balls are disposed is decreased. Therefore, mother boards manufactured by a buildup process or the like need to be used. As a result, a drawback arises in that mother boards are expensive.

SUMMARY OF THE INVENTION

In view of the aforementioned facts, an object of the present invention is to provide a semiconductor package for three-dimensional mounting which can be mounted at a higher packaging density than conventional BGA type semiconductor packages and is easy to fabricate, a fabrication method thereof, and a semiconductor device formed by mounting the semiconductor package for three-dimensional mounting on a mother board.

A first aspect of the present invention is a semiconductor package for three-dimensional mounting comprising: a first substrate (a wiring substrate) having an upper surface on which a first metal pattern (a first wiring pattern) is formed and a lower surface on which a second metal pattern (a second wiring pattern) is formed, said first metal pattern and second metal pattern being electrically connected to each other; a semiconductor chip which is placed on the upper surface of the first substrate and is electrically connected to the first metal pattern; a sealing resin layer which is formed on the upper surface of the first substrate and seals the semiconductor chip and the first metal pattern; a conductive wire (a thickness direction wire) which passes through the resin layer and has one end electrically connected to the first metal pattern and the other end exposed at a top surface of the resin layer; and a first electrode (a lower surface connecting electrode) which is formed on the lower surface of the first substrate and is electrically connected to the second metal pattern.

When the semiconductor package for three-dimensional mounting is mounted on a pad of a mother board, and then a semiconductor package for three-dimensional mounting having a similar structure or a daughter board is stacked on the semiconductor package for three-dimensional mounting, the lower surface connecting electrode functions as a connecting terminal which electrically connects the semiconductor package for three-dimensional mounting to the mother board. The other end of the thickness direction wire functions as a connecting terminal which electrically connects the semiconductor package for three-dimensional mounting to the semiconductor package for three-dimensional mounting or the daughter board stacked above.

Therefore, the semiconductor chip is electrically connected to the mother board via the first and second wiring patterns on the wiring substrate and the lower surface connecting electrode. Further, the semiconductor chip is electrically connected via the first wiring pattern and the thickness direction wire to a semiconductor chip of the semiconductor package for three-dimensional mounting stacked above or to a semiconductor circuit formed on the daughter board.

A second aspect of the present invention is a semiconductor package for three-dimensional mounting according to the first aspect, further comprising a second substrate (a rewiring substrate) placed on the surface of the resin layer, having an upper surface and a lower surface opposite the upper surface, wherein the second substrate includes a third metal pattern (a third wiring pattern) which is electrically connected to the other end of the conductive wire from the lower surface of the second substrate, and a second electrode (an upper surface connecting electrode) which is formed on the upper surface of the second substrate and is electrically connected to the third metal pattern.

In the semiconductor package for three-dimensional mounting according to the second aspect, the third wiring pattern may be different from the first and second wiring patterns. Thus, connecting wiring which is different from the lower surface connecting electrode at the wiring substrate can be formed at the rewiring substrate.

Moreover, the upper surface connecting electrode can be provided above the semiconductor chip. Therefore, as compared with the semiconductor package for three-dimensional mounting in which the other end of the thickness direction wire is used as the upper connecting electrode, more upper surface connecting electrodes can be formed, and the interval between the upper connecting electrodes can be made larger.

A third aspect of the present invention is a semiconductor package for three-dimensional mounting according to the first or second aspect, further comprising: a fourth metal pattern which is formed on the surface of the resin layer and is electrically connected to the other end of the conductive wire; an insulating layer which covers the fourth metal pattern; and an third electrode which is exposed from the insulating layer and is electrically connected to the fourth metal pattern.

In addition to the advantages of the semiconductor package for three-dimensional mounting according to the second aspect, the semiconductor package for three-dimensional mounting of the third aspect has the advantages that it can be made thinner since no rewiring substrate is necessary and that it is highly reliable.

A fourth aspect of the present invention is a method of fabricating a semiconductor package for three-dimensional mounting, comprising: (a) placing a semiconductor chip on an upper surface of a substrate, said substrate having the upper surface on which a first metal pattern is formed and a lower surface on which a second metal pattern is formed, said first metal pattern and second metal pattern being electrically connected to each other; (b) electrically connecting the semiconductor chip and the first metal pattern to each other; (c) sealing the semiconductor chip and the first metal pattern with sealing resin; and (d) forming, in the sealing resin, a through hole which reaches the first metal pattern, and forming a wire inside the through hole to electrically connect to the first metal pattern.

In accordance with the method of fabricating a semiconductor package for three-dimensional mounting of the fourth aspect, the semiconductor package for three-dimensional mounting of the first aspect can be easily fabricated.

A fifth aspect of the present invention is a semiconductor device in which the semiconductor package for three-dimensional mounting of the first to third aspects is mounted on a mother board.

As described above, according to the present invention, elements can be mounted on a mother board in a three-dimensional manner. Therefore, there is provided a semiconductor package for three-dimensional mounting which can be mounted at a higher packaging density than conventional BGA type semiconductor packages and is easy to fabricate. Further, there are also provided a fabrication method of the semiconductor package for three-dimensional mounting, and a semiconductor device formed by mounting the semiconductor package for three-dimensional mounting on a mother board.

DESCRIPTION OF THE PREFERRED EMBODIMENTS

First Embodiment

Figure 1:
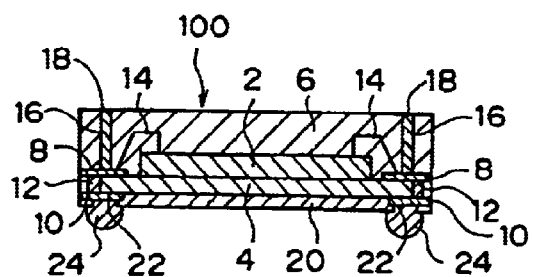
FIG. 1 is a sectional view, in a thickness direction, of an example of a semiconductor package for three-dimensional mounting according to the present invention.
Figure 2:
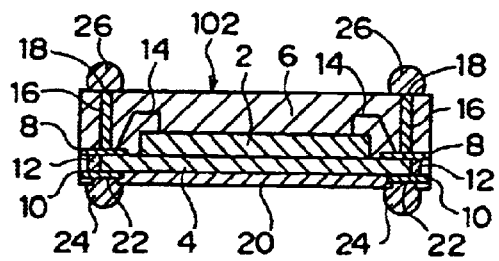
FIG. 2 is a sectional view of an example of the three-dimensional semiconductor package of FIG. 1 in which solder balls are welded to connecting surfaces at the end portions of thickness direction wires.

An example of a semiconductor package for three-dimensional mounting according to the present invention is shown in FIGS. 1 and 2.

As illustrated in FIG. 1, a semiconductor package 100 for three-dimensional mounting according to the first embodiment includes a wiring substrate 4 and a semiconductor chip 2 placed on one surface of the wiring substrate 4.

A first pattern 8 is formed at the surface of the wiring substrate 4 on which the semiconductor chip 2 is placed, while a second pattern 10 is formed at a surface of the wiring substrate 4 opposite the first pattern 8. The first wiring pattern 8 and the second wiring pattern 10 are connected to each other via through holes 12 which pass through the wiring substrate 4.

The surface of the wiring substrate 4 having the second wiring pattern 10 formed thereon is covered with a resist layer 20 which is formed by a photoresist resin. Openings 22, which are each circular and serve as a bottom surface contact electrode of the semiconductor package for three-dimensional mounting according to the present invention, are provided so as to correspond to the position of the second wiring pattern 10. Since the second wiring pattern 10 is exposed at the openings 22, when the semiconductor package 100 for three-dimensional mounting is mounted on a mother board or the like, the second wiring pattern 10 is electrically connected to the mother board at the positions of the openings 22. A solder ball 24 is bonded to each of the openings 22.

As illustrated in FIGS. 1 and 2, the semiconductor chip 2 and the first wiring pattern 8 are connected to each other by wires 14 which are fine lines of gold or silver.

A sealing resin layer 6 is formed on the surface of the wiring substrate 4 on which the semiconductor chip 2 is placed. The sealing resin layer 6 is formed by using epoxy resin or the like in a transfer method or the like. The semiconductor chip 2, the first wiring pattern 8, and the wires 14 are embedded in the sealing resin layer 6.

Columnar wires 16 are disposed so as to pass through the sealing resin layer 6 in the direction of thickness thereof. The lower end of each of the thickness direction wires 16 is connected to the first wiring pattern 8, while the upper end thereof is exposed at the surface of the sealing resin layer 6 so as to form an upper connecting surface 18. As described above, the first wiring pattern 8 is formed at the surface of the wiring substrate 4 opposite the second wiring pattern 10. Further, the thickness direction wires 16 are provided so as to correspond to the positions of the openings 22. Therefore, the upper connecting surfaces 18 are also formed so as to correspond to the positions of the openings 22. In other words, the upper connecting surfaces 18 are located directly above the openings 22 respectively.

In the semiconductor package 100 for three-dimensional mounting, a solder ball 26 is placed on each of the upper connecting surfaces 18. FIG. 2 shows a semiconductor package 102 for three-dimensional mounting with the solder balls 26 placed on the respective upper connecting surfaces 18.

In the first embodiment, by using the vertical wire passing through the resin, a terminal for electrical connection to the exterior is provided at the lower surface of the circuit substrate and the surface of the sealing resin parallel to the lower surface. Namely, in the present embodiment, stacking of plural packages is made possible by the wire provided at the resin which seals the semiconductor element and the wiring patterns.

As described above, in the present embodiment, the wire which enables stacking of plural semiconductor packages is provided at the sealing resin. Accordingly, in the present embodiment, there is no need for a structure such as a substrate to the sides of which a potential is applied. As a result, a semiconductor device can be provided at a lower cost.

Further, in the present embodiment, the wire enabling stacking of plural semiconductor packages can be provided at a desired position of the sealing resin, which position corresponds to the first wiring pattern. Therefore, no extra area for forming the wire is necessary. As a result, a semiconductor package of a smaller size can also be provided. Specifically, it is possible to provide a semiconductor package which is about 0.2 $\mu$m larger than the outermost portions of the respective first wiring patterns formed on the circuit substrate.

The semiconductor package 100 for three-dimensional mounting illustrated in FIG. 1 and the semiconductor package 102 for three-dimensional mounting illustrated in FIG. 2 are fabricated by the process illustrated in FIGS. 4 through 9, for example.

Figure 4:
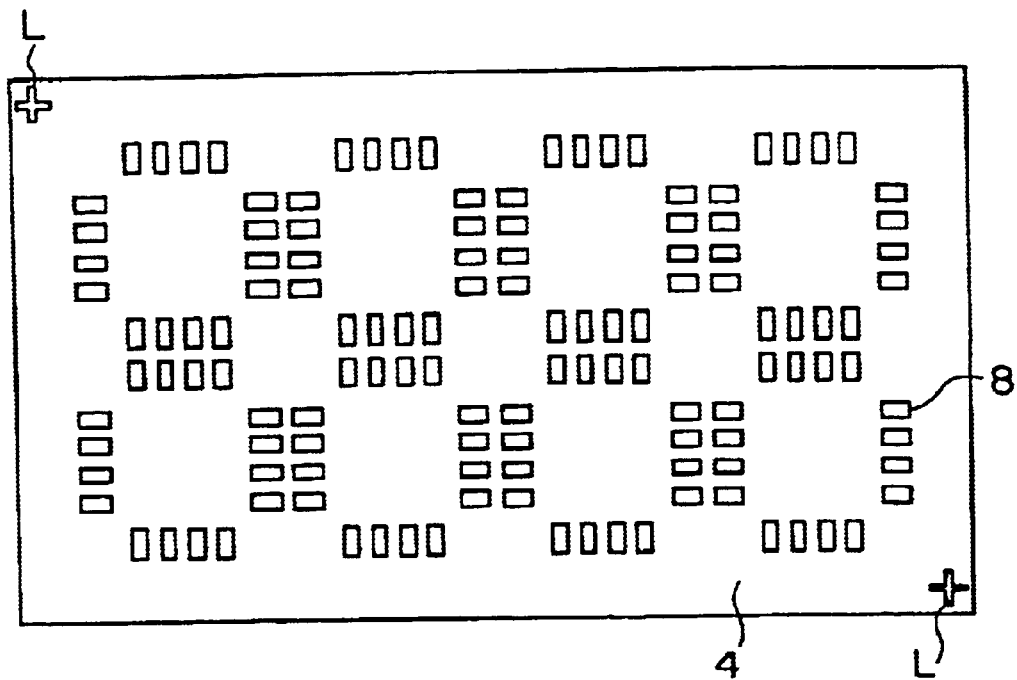
FIG. 4 is a plan view showing a state in which a first wiring pattern is formed on a wiring substrate of the semiconductor package for three-dimensional mounting shown in FIGS. 1 and 2.

First, for example, as shown in FIG. 4, on the surface of the wiring substrate 4 having a rectangular shape in plan view, eight of the first wiring patterns 8 (i.e., two rows of four first wiring patterns 8 in the longitudinal direction of the wiring substrate 4) are formed in total. In each of the first wiring patterns 8, small strap-shaped conductors are arranged in a square configuration. The second wiring patterns 10 are formed at the rear surface of the wiring substrate 4, and the first wiring patterns 8 and the second wiring patterns 10 are connected to one another via the plated through holes 12. In FIG. 4, the second wiring patterns 10 and the plated through holes 12 are omitted. The configuration of the wiring substrate 4 in plan view and the arrangement of the first wiring patterns 8 are not limited to the example illustrated in FIG. 4. Highly conductive metals such as copper can be used for both the first wiring patterns 8 and the second wiring patterns 10. When the first wiring patterns 8 and the second wiring patterns 10 are formed, it is preferable that a registration mark L is formed at each of the upper left and lower right corners of the wiring substrate 4 in FIG. 4 by patterning or the like. An example of the registration mark is a cross-shaped mark shown in FIGS. 4 through 9.

Figure 5:
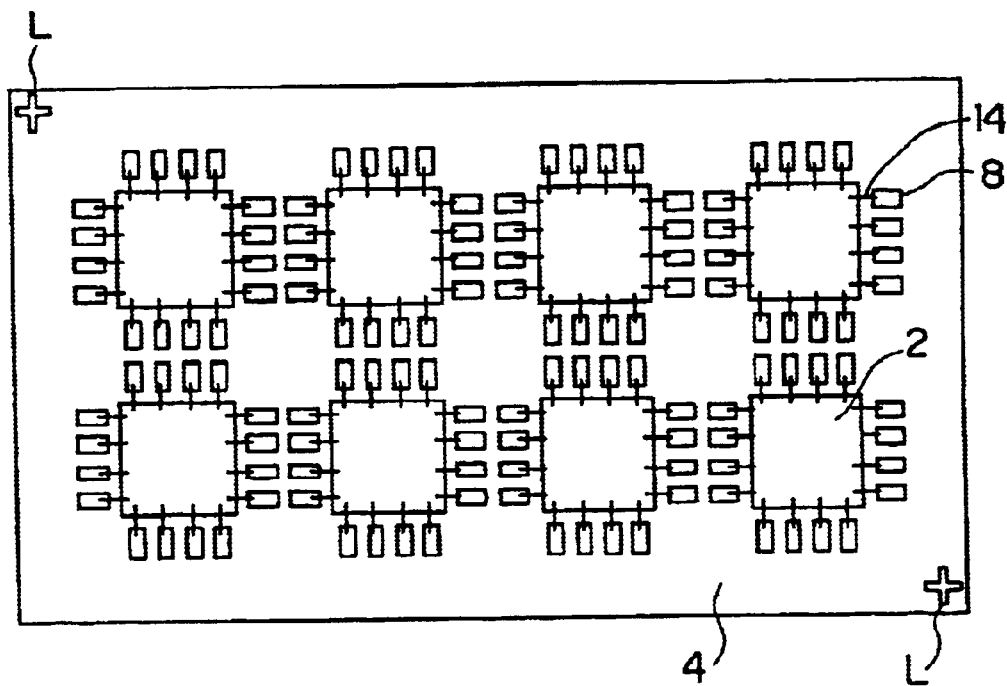
FIG. 5 is a plan view showing a state in which semiconductor chips are placed on and bonded to the surface of the wiring substrate having the first wiring pattern formed thereon, and terminals of the semiconductor chips are connected to the first wiring pattern by wires.

Next, a semiconductor chip wiring process is carried out. In this process, as shown in FIG. 5, in the wiring substrate 4, a semiconductor chip 2 is bonded to a central portion of each of the squares formed by eight of the first wiring patterns 8. Terminals of the semiconductor chips 2 and the first wiring patterns 8 are connected to one another by the wires 14 in accordance with a wire bonding method.

Subsequently, in a sealing resin layer forming process, the first wiring patterns 8, the semiconductor chips 2, and the wires 14 on the wiring substrate 4 are sealed with sealing resin such as epoxy resin in accordance with the transfer method, thereby forming a sealing resin layer 6.

The sealing resin layer 6 is formed on the circuit substrate and has a thickness of about 400 $\mu$m.

Next, a thickness direction wire forming process is carried out as follows.

Figure 6:
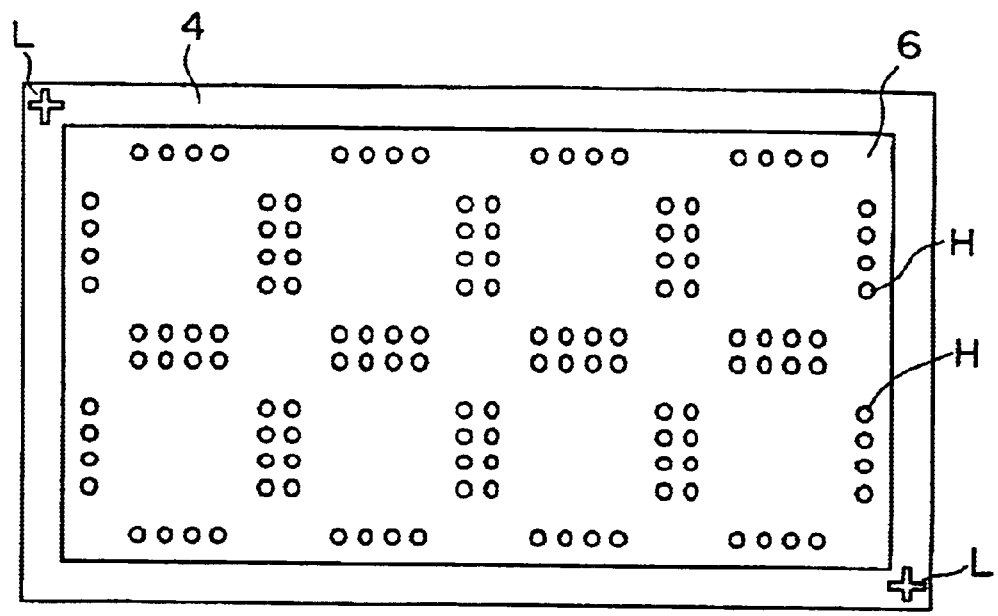
FIG. 6 is a plan view showing a state in which a sealing resin layer is formed on the surface of the wiring substrate having the semiconductor chips placed thereon so that the first wiring pattern and the semiconductor chips are sealed, and further, holes are formed in the sealing resin layer so as to correspond to the position of the first wiring pattern.

First, in the sealing resin layer 6 which has been formed in the sealing resin layer forming process, through holes H are formed so as to correspond to the positions of the first wiring patterns 8. In order to form the through holes H in the sealing resin layer 6, for example, it is possible to adopt a method in which positions to be irradiated by a laser beam are determined so as to correspond to the positions of the first wiring patterns 8 with the registration marks L formed at the wiring substrate 4 serving as a reference, and a laser beam is irradiated onto the determined positions. A YAG laser or the like can be used as the laser beam. As described above, since the first wiring pattern 8 is generally formed of a thin copper film, although the laser beam is absorbed by the sealing resin forming the sealing resin layer 6, the laser beam is not absorbed and is reflected at the first wiring pattern 8. Accordingly, in accordance with the aforementioned method, the through holes H can be formed so as to pass through the sealing resin layer 6 and reach the first wiring patterns 8. Further, formation of the through holes H causes little damage to the first wiring patterns 8. FIG. 6 illustrates the wiring substrate 4 having the through holes H formed in the sealing resin layer 6.

After the through holes H have been formed in the sealing resin layer 6, in order to operate the first wiring patterns 8 as one electrode, the thickness direction wires 16 are formed by depositing solder inside the through holes H in accordance with a plating method. In place of forming the thickness direction wires 16 by a plating method, the thickness direction wires 16 can also be formed in accordance with a printing method in which the through holes H are filled with solder paste, and then the solder paste is melted and solidified.

Figure 9:
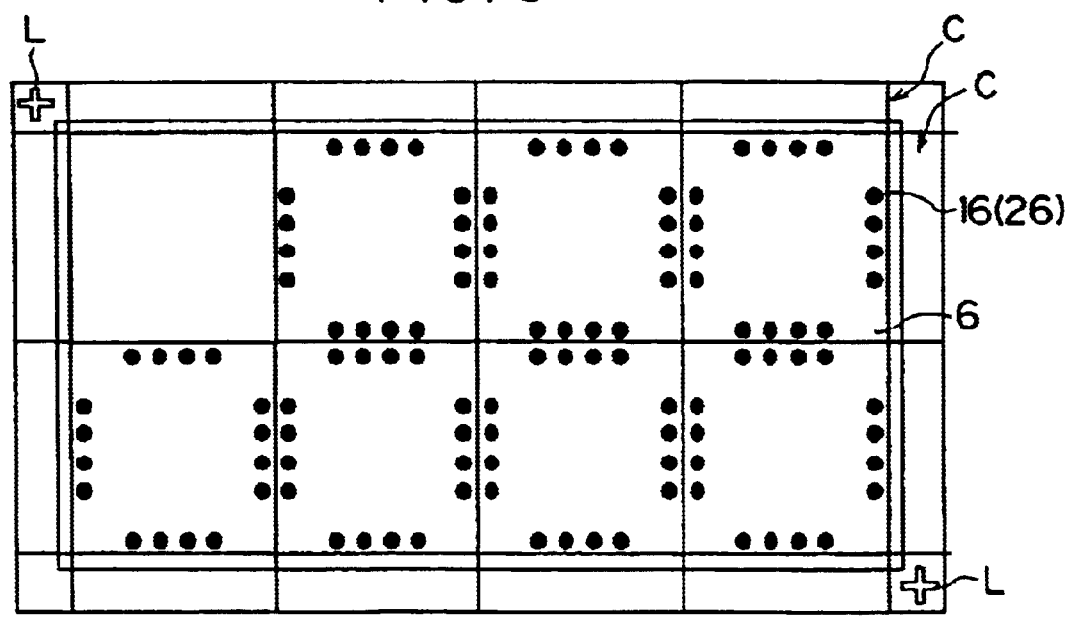
FIG. 9 is a plan view showing a process in which the three-dimensional semiconductor package illustrated in FIG. 1 or 2 is formed by cutting the wiring substrate illustrated in FIG. 7 or 8 in a grid-like pattern.

Finally, the semiconductor package 100 for three-dimensional mounting illustrated in FIG. 1 is obtained by cutting the wiring substrate 4 into a grid-like pattern along cutting lines C as illustrated in FIG. 9, using a dicing plate or the like.

In the present embodiment, after the sealing resin layer which seals the semiconductor chip and the first patterns has been formed, the wires which enable stacking are formed so as to extend from the surface of the sealing resin layer. After the wires have been formed, the wiring substrate is cut along the dicing lines and divided into individual packages.

In this way, in the fabrication method of the present embodiment, the through hole in which a wire is provided can be formed by irradiating a laser beam onto the surface of the sealing resin. Therefore, the thickness direction wires can be collectively formed at desired positions of the sealing resin, which positions correspond to the first wiring patterns. As a result, by subjecting the wiring substrate to the subsequent cutting process, plural semiconductor packages can be simultaneously formed.

Further, in the present embodiment in which, after plural semiconductor packages have been simultaneously formed on the wiring substrate, the wiring substrate is cut and divided into individual semiconductor packages, semiconductor packages of a smaller size can be provided by cutting the wiring substrate at positions which are each spaced from the respective first wiring patterns by about 0.2 $\mu$m. Each of the first wiring patterns is electrically connected to the thickness direction wire and the semiconductor element, and is disposed at a position which is the most distant from the semiconductor element.

The semiconductor package 102 for three-dimensional mounting illustrated in FIG. 2 can be fabricated in accordance with the same procedure for the fabrication of the semiconductor package 100 for three-dimensional mounting shown in FIGS. 4 through 7 as far as the formation of the thickness direction wires 16.

Figure 8:
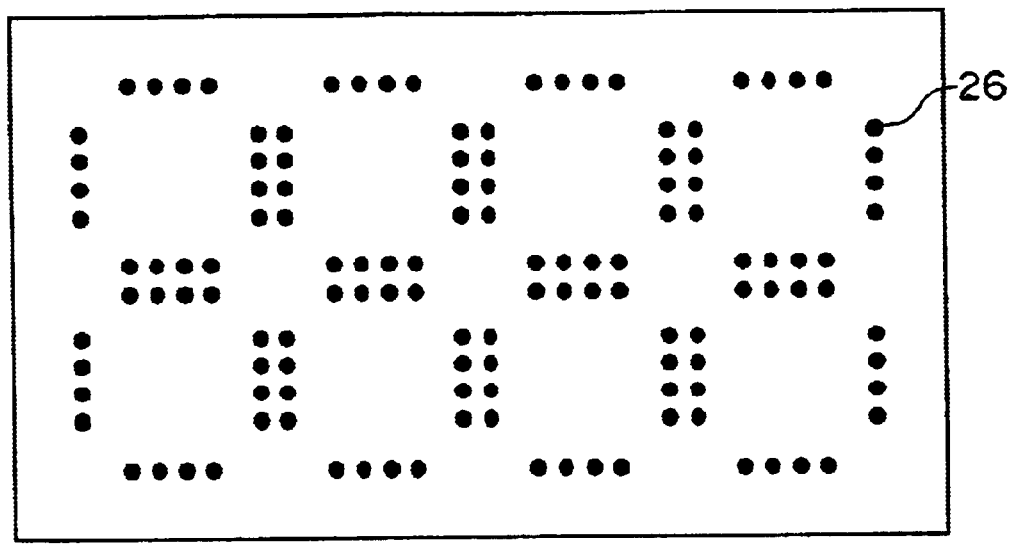
FIG. 8 is a plan view showing a state in which solder balls are welded to the connecting surfaces at the end portions of the thickness direction wires.

Subsequently, as shown in FIG. 8, the solder ball 26 is placed onto and bonded to the upper connecting surface 18 of each of the thickness direction wires 16. Finally, the semiconductor package 102 for three-dimensional mounting in FIG. 2 is obtained by cutting the wiring substrate 4 into a grid-like pattern along the cutting lines C as illustrated in FIG. 9, using a dicing plate or the like.

Figure 3:
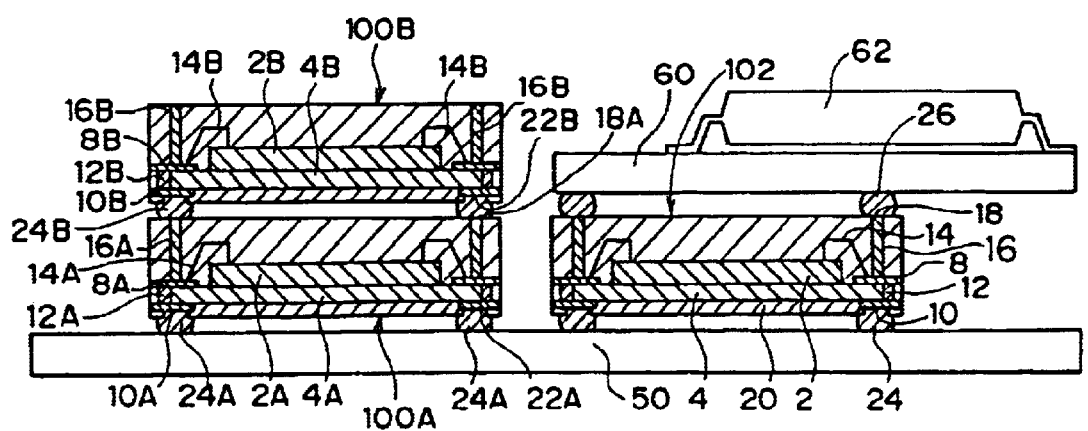
FIG. 3 is a schematic view of an example of a semiconductor device in which the three-dimensional semiconductor packages for mounting shown in FIGS. 1 and 2 are mounted on a mother board.

Shown in FIG. 3 is an example of semiconductor devices in which the semiconductor package 100 for three-dimensional mounting in FIG. 1 and the semiconductor package 102 for three-dimensional mounting in FIG. 2 are mounted on a mother board. In FIG. 3, the structure on the left is a semiconductor device in which two of the semiconductor packages 100 for three-dimensional mounting (only one is illustrated in FIG. 1) are stacked and mounted on a mother board, while the structure on the right is a semiconductor device in which the semiconductor package 102 for three-dimensional mounting is mounted on a mother board, and a daughter board is mounted on the semiconductor package 102 for three-dimensional mounting.

In the semiconductor package of the present embodiment, two or more semiconductor elements of the same type, or two or more semiconductor elements having the same terminal arrangement, are mounted. When the semiconductor elements to be mounted are memory elements, storage capacity can be increased.

In FIG. 3, an example of the left semiconductor device is a semiconductor device in which two or more RAMs are stacked on a mother board.

In the left semiconductor device of FIG. 3, the semiconductor package 100 for three-dimensional mounting shown in FIG. 1 is bonded to a pad of a mother board 50 via the solder balls 24, and still another semiconductor package 100 for three-dimensional mounting is connected to the upper surface of the semiconductor package 100 for three-dimensional mounting which is bonded to the mother board 50. Hereinafter, the semiconductor package 100 for three-dimensional mounting which is bonded to the mother board 50 is referred to as a "semiconductor package 100A for three-dimensional mounting", while the semiconductor package 100 for three-dimensional mounting which is bonded to the upper surface of the semiconductor package 100A for three-dimensional mounting is referred to as a "semiconductor package 100B for three-dimensional mounting".

Examples of a semiconductor chip 2A in the semiconductor package 100A for three-dimensional mounting and a semiconductor chip 2B in the semiconductor package 100B for three-dimensional mounting include DRAMs and the like.

In the above-described semiconductor device, each of the openings 22B of the semiconductor package 100B for three-dimensional mounting is electrically connected to a connecting surface 18A of the semiconductor package 100A for three-dimensional mounting via solder balls 24B. Therefore, in the semiconductor device described above, since the openings 22B and the upper connecting surfaces 18A function as connecting terminals, the upper connecting surfaces 18A also function as upper connecting electrodes of the semiconductor package 100A for three-dimensional mounting.

Accordingly, the semiconductor chip 2A of the semiconductor package 100A for three-dimensional mounting is electrically connected to a semiconductor circuit on the mother board 50 via wires 14A, a first wiring pattern 8A, plated through holes 12A, a second wiring pattern 10A, and solder balls 24A of the semiconductor package 100A for three-dimensional mounting. At the same time, the semiconductor chip 2A is electrically connected to the semiconductor chip 2B via thickness direction wires 16A of the semiconductor package 100A for three-dimensional mounting, and the solder balls 24B, a second wiring pattern 10B, plated through holes 12B, a first wiring pattern 8B, and wires 14B of the semiconductor package 100B for three-dimensional mounting.

In the semiconductor device described above, two of the semiconductor packages 100 for three-dimensional mounting are stacked. However, the number of the semiconductor packages 100 for three-dimensional mounting to form a stack is not limited to two.

An example of the right semiconductor device in FIG. 3 is a semiconductor device in which the semiconductor package 102 for three-dimensional mounting is mounted onto a mother board having a CPU stacked thereon, and a daughter board having a video image processing circuit, a sound source circuit, a CPU upgrading circuit, and the like formed thereon is mounted onto the semiconductor package 102 for three-dimensional mounting.

In the right semiconductor device in FIG. 3, the semiconductor package 102 for three-dimensional mounting illustrated in FIG. 2 is bonded to the pad of the mother board via the solder balls 24, while a daughter board 60 having a semiconductor element 62 mounted thereon is bonded to the upper surface of the semiconductor package 102 for three-dimensional mounting via the solder balls 26. A pad can be provided on a surface of the daughter board 60 opposite the surface on which the semiconductor element 62 is mounted so as to be bonded to the solder balls 26 of the semiconductor package 102 for three-dimensional mounting.

The semiconductor chip 2 in the semiconductor package 102 for three-dimensional mounting is electrically connected to the semiconductor circuit on the mother board 50 via components similar to those of the semiconductor package 100 for three-dimensional mounting. Further, the semiconductor chip 2 is electrically connected to the semiconductor element 62 on the daughter board 60 via the first wiring pattern 8, the wires 14, the thickness direction wires 16, and the solder balls 26.

In this way, the semiconductor package for three-dimensional mounting according to the first embodiment can be suitably used to mount semiconductor chips of the same type in a highly integrated manner or to mount a daughter board on a mother board.

Second Embodiment

Figure 10:
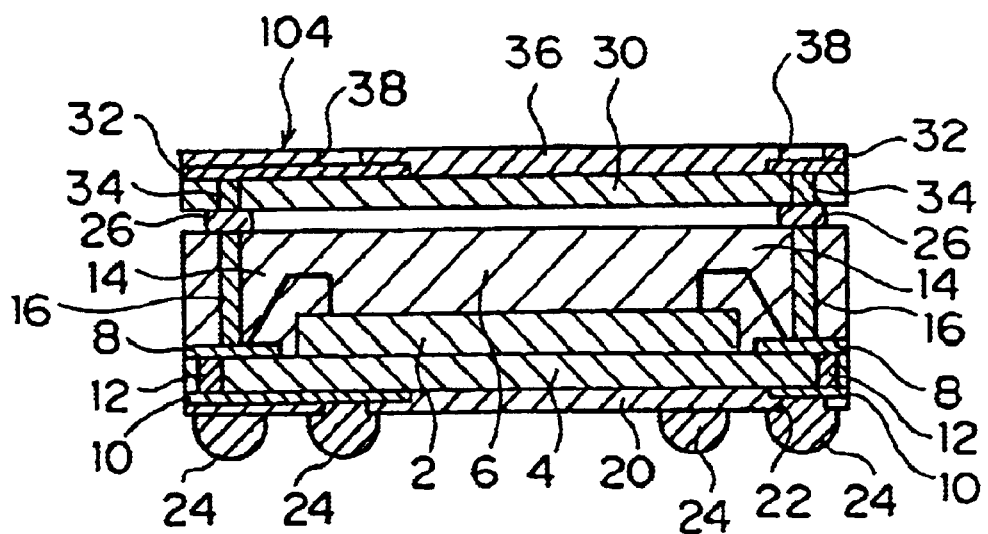
FIG. 10 is a sectional view, in a thickness direction, of another example of a semiconductor package for three-dimensional mounting according to the present invention.
Figure 11:
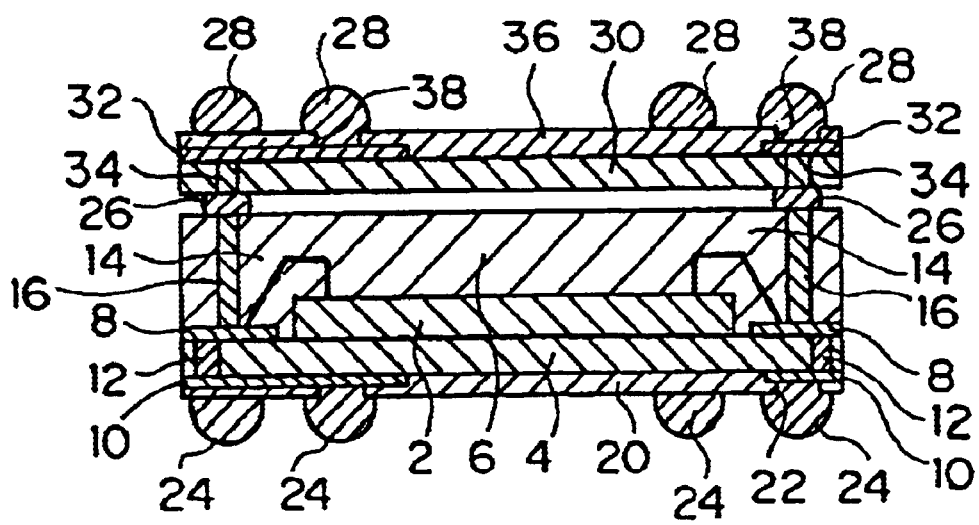
FIG. 11 is a sectional view of an example of the semiconductor package for three-dimensional mounting illustrated in FIG. 10 in which solder balls are welded to a third wiring pattern, which has been formed on a rewiring substrate, at openings formed at the upper surface of the rewiring substrate.

Another example of the semiconductor package for three-dimensional mounting according to the present invention is shown in FIGS. 10 and 11. In these figures, reference numerals which are the same as those shown in FIGS. 1 to 3 indicate components identical to those indicated by the reference numerals in FIGS. 1 to 3.

As illustrated in FIG. 10, a semiconductor package 104 for three-dimensional mounting according to the second embodiment has a structure in which a rewiring substrate 30 is placed, via the solder balls 26, on the upper connecting surfaces 18 of the semiconductor package for three-dimensional mounting according to the first embodiment, which upper connecting surfaces 18 are located at one end of the thickness direction wires 16.

A third wiring pattern 32, which may be different from the first wiring pattern 8 and the second wiring pattern 10, is formed at an upper surface of the rewiring substrate 30. The third wiring pattern 32 is electrically connected to the solder balls 26 via plated through holes 34 passing through the rewiring substrate 30. Further, the upper surface of the rewiring substrate 30, that is, the surface of the rewiring substrate 30 opposite the surface which is electrically connected to the upper connecting surfaces 18, is covered with a resist layer 36 formed by a photoresist resin. Openings 38 which are circular are formed in predetermined positions of the resist layer 36, and the third wiring pattern 32 is exposed thereat. The openings 38 correspond to the upper connecting electrodes of the semiconductor package for three-dimensional mounting of the present invention. A solder ball 28 can be bonded to each of the openings 38 by means of welding or the like. FIG. 11 is an example of the semiconductor package 104 for three-dimensional mounting in which the solder balls 28 are welded to the openings 38.

In the semiconductor package 104 for three-dimensional mounting according to the second embodiment, as shown in FIGS. 10 and 11, the openings 38 can be formed not only above the connecting surfaces 18 but also above the semiconductor chip 2. As a result, as compared with the semiconductor package for three-dimensional mounting according to the first embodiment, more upper surface connecting electrodes can be formed at the upper surface.

Moreover, as described above, the third wiring pattern 32 may be different from both the first wiring pattern 8 and the second wiring pattern 10. Therefore, the openings 38 need not be necessarily formed directly above the openings 22 and the connecting surfaces 18. In general, if the wiring of the semiconductor chip 2 is different, the positions of the openings 22 at the bottom surface of the wiring substrate 4 and the positions of the connecting surfaces 18 are also different. However, as for the semiconductor package 104 for three-dimensional mounting, even when the semiconductor packages for three-dimensional mounting which have different types of semiconductor chips are stacked, by appropriately selecting the third wiring pattern so that the positions of the openings 38 of the semiconductor package for three-dimensional mounting correspond to the positions of the openings 22 formed at the bottom surface of the semiconductor package for three-dimensional mounting stacked above, the semiconductor package for three-dimensional mounting can be connected to the semiconductor package stacked above.

Accordingly, if the semiconductor package 104 for three-dimensional mounting is used, system-on-chip mounting such as a combination of memory such as a flash memory and a one-chip microcomputer, a combination of a custom logic such as G/A and a one-chip microcomputer, and a combination of an analog device and a digital device can be carried out without a mother board being interposed therebetween. Therefore, the semiconductor package 104 for three-dimensional mounting is preferable as a semiconductor package for a cellular phone in which the mounting area is strictly limited and for equipment in which high-speed operation is required.

Third Embodiment

Figure 12A:
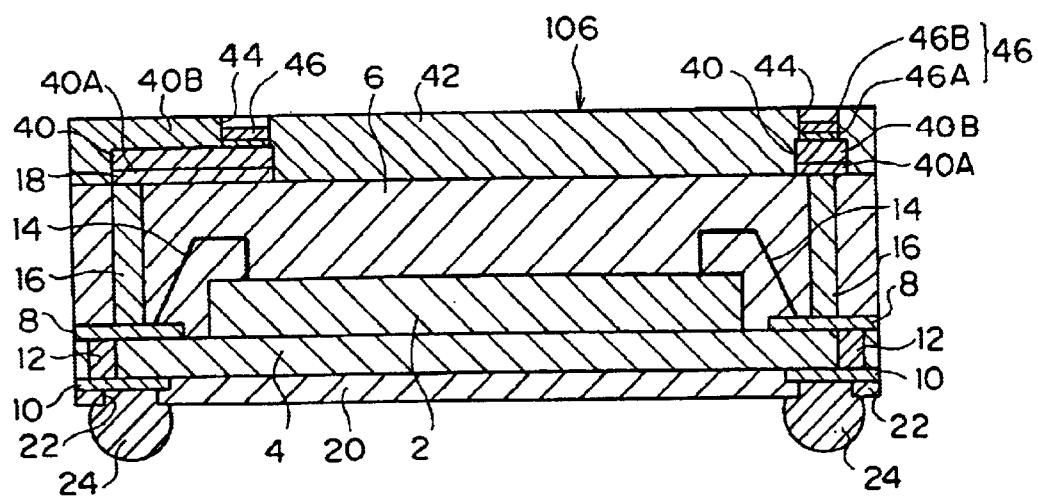
FIGS. 12A and 12B are respectively a sectional view in a thickness direction and a plan view of still another example of a semiconductor package for three-dimensional mounting according to the present invention.
Figure 12B:
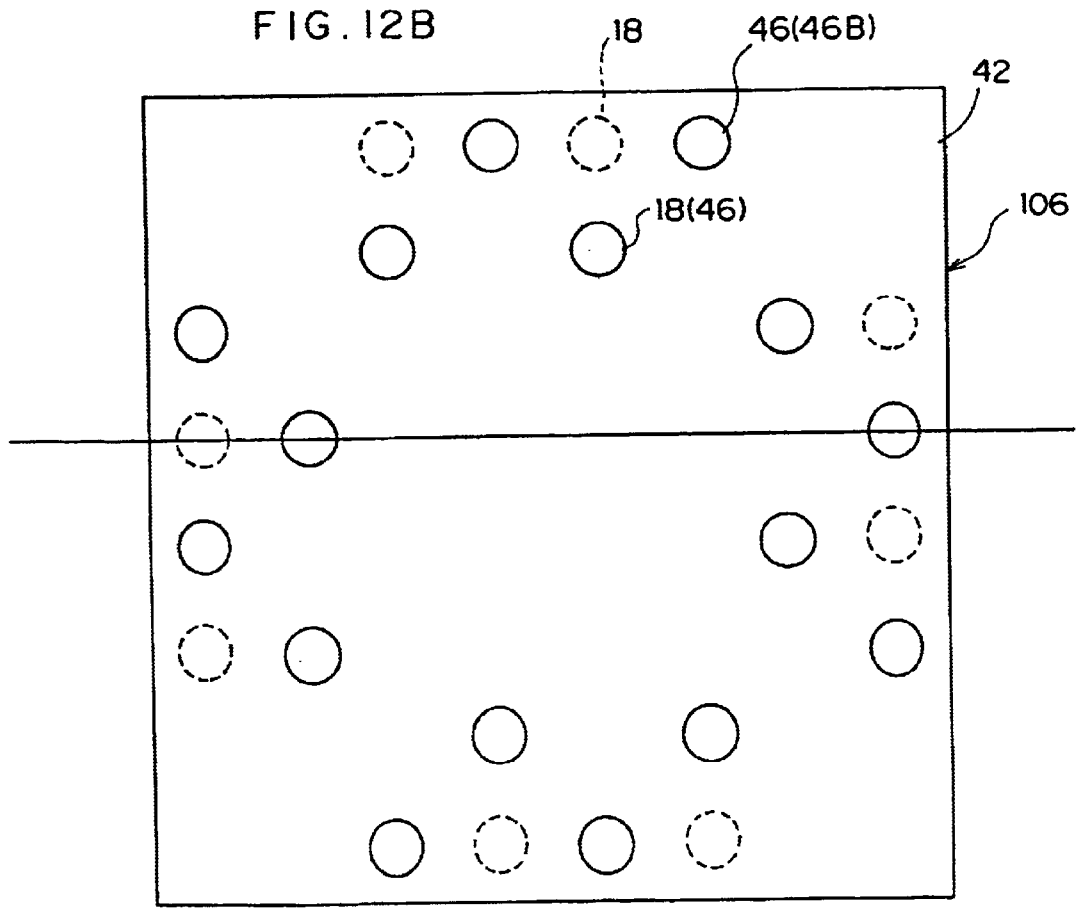

Still another example of the semiconductor package for three-dimensional mounting according to the present invention is illustrated in FIGS. 12A and 12B. FIG. 12A shows a cross-section of a semiconductor package for three-dimensional mounting in a thickness direction, while FIG. 12B shows the shape of the semiconductor package for three-dimensional mounting when seen from the top. Reference numerals which are the same as those in FIGS. 1 to 3 indicate components identical to those indicated by the reference numerals in FIGS. 1 to 3.

As shown in FIGS. 12A and 12B, a semiconductor package 106 for three-dimensional mounting according to the third embodiment has a structure in which a fourth wiring pattern 40 is formed at the upper surface of the sealing resin layer 6 of the semiconductor package for three-dimensional mounting according to the first embodiment. Further, the fourth wiring pattern 40 is electrically connected to the connecting surfaces 18 of the semiconductor package 106 for three-dimensional mounting.

A resist layer 42 formed by a photoresist resin is formed at the upper surface of the sealing resin layer 6, and the fourth wiring pattern 40 is covered with the resist layer 42.

The fourth wiring pattern 40 includes an electroless copper plating layer 40A and an electrolytic copper plating layer 40B laminated on the surface of the electroless copper plating layer 40A.

In the resist layer 42, resist openings 44 are provided at predetermined positions above the fourth wiring pattern 40. An upper electrode 46, which corresponds to the upper surface connecting electrode in the semiconductor package for three-dimensional mounting according to the present invention, is formed inside each of the resist openings 44. The upper electrode 46 is formed by two layers, that is, a nickel layer 46A which contacts the fourth wiring pattern 40 and a gold layer 46B laminated on the nickel layer 46A. The upper electrode 46 has a function of preventing the copper forming the fourth wiring pattern 40 from being oxidized at the resist opening 44, while the nickel layer 46A has a function of preventing mutual diffusion between the copper forming the fourth wiring pattern 40 and the gold forming the gold layer 46B. The upper electrode 46 may be an electrode having a single layer of solder.

The semiconductor package 106 for three-dimensional mounting can be fabricated as follows.

The procedure is the same as that described in the first embodiment as far as the first wiring pattern 8 is formed on the wiring substrate 4 and then the thickness direction wires 16 and the connecting surfaces 18 are formed. Specifically, these processes can be carried out in accordance with the processes illustrated in FIGS. 4 through 7.

Figure 13:
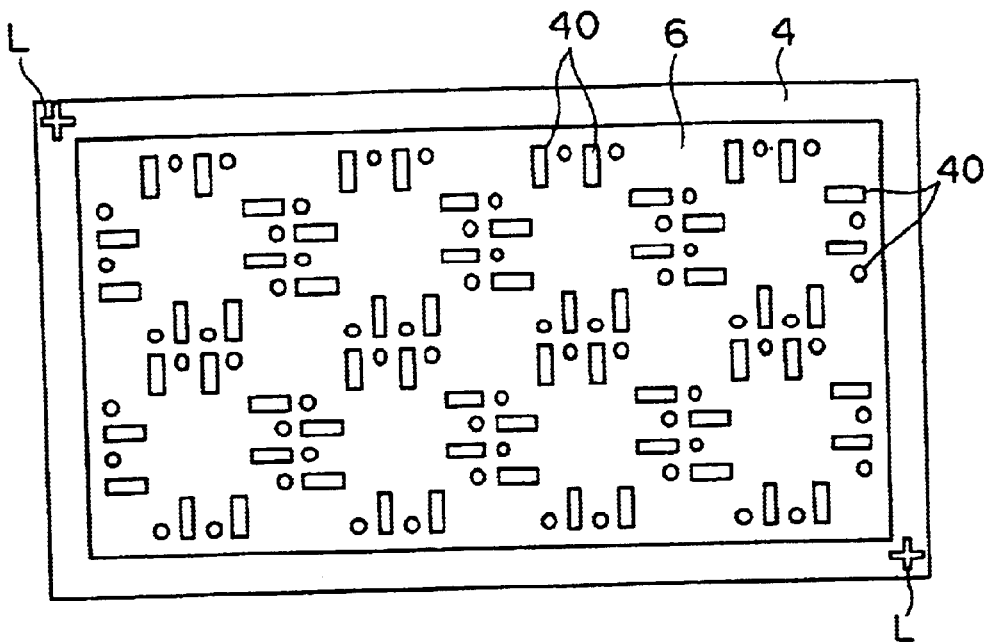
FIG. 13 is a plan view of the semiconductor package for three-dimensional mounting illustrated in FIG. 12 in which a fourth wiring pattern is formed.

Once the thickness direction wires 16 are formed at the wiring substrate 4, as shown in FIG. 13, the fourth pattern 40 is formed at the upper surface of the sealing resin layer 6 so as to correspond to the positions of the connecting surfaces 18.

The fourth wiring pattern 40 can be formed by the following process.

Figure 7:
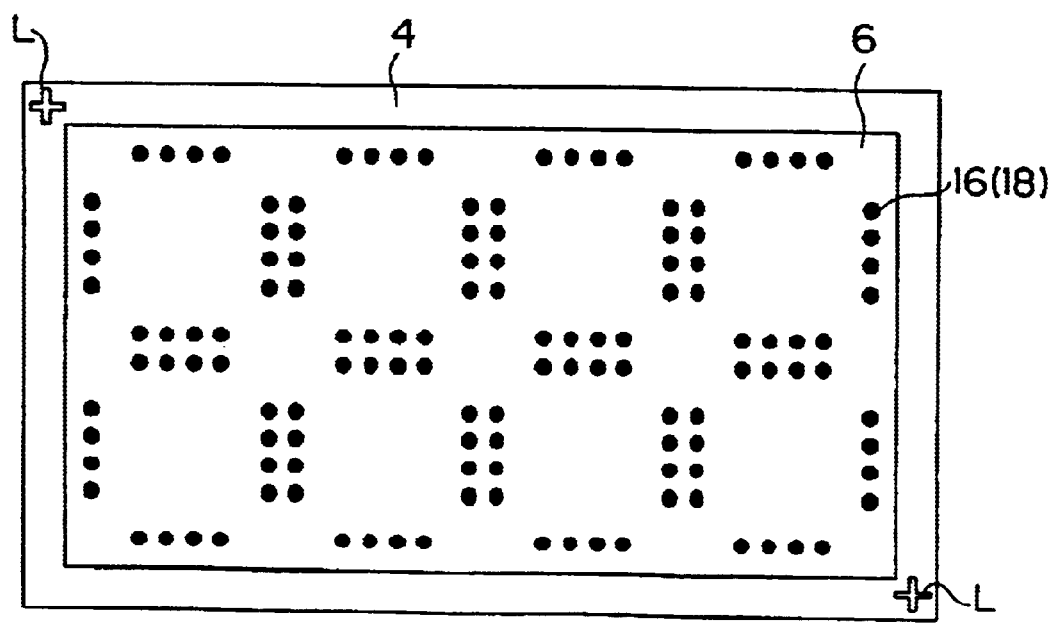
FIG. 7 is a plan view showing a state in which thickness direction wires are formed so as to respectively pass through the holes formed in the sealing resin layer.

First, in the state shown in FIG. 7, portions such as the rear surface of the wiring substrate 4 which does not need plating are masked, and the surface of the wiring substrate 4 is plated with copper by electroless plating. In this way, a copper coat is formed on the entire surface of the sealing resin layer 6 which is insulative. Subsequently, copper is electro-plated on the copper coat which has been formed by electroless plating and serves as an electrode. As a result, a copper layer having a sufficient thickness and having low electrical resistance is formed.

Next, predetermined patterning is carried out on the copper coat by photoetching or the like so that the fourth wiring pattern 40 is formed. Metal which forms the fourth wiring pattern 40 is not limited to copper. Further, in place of using electroless plating, spattering or a vacuum evaporation method may be used to form a coat of metal such as copper on the sealing resin layer 6.

Figure 14:
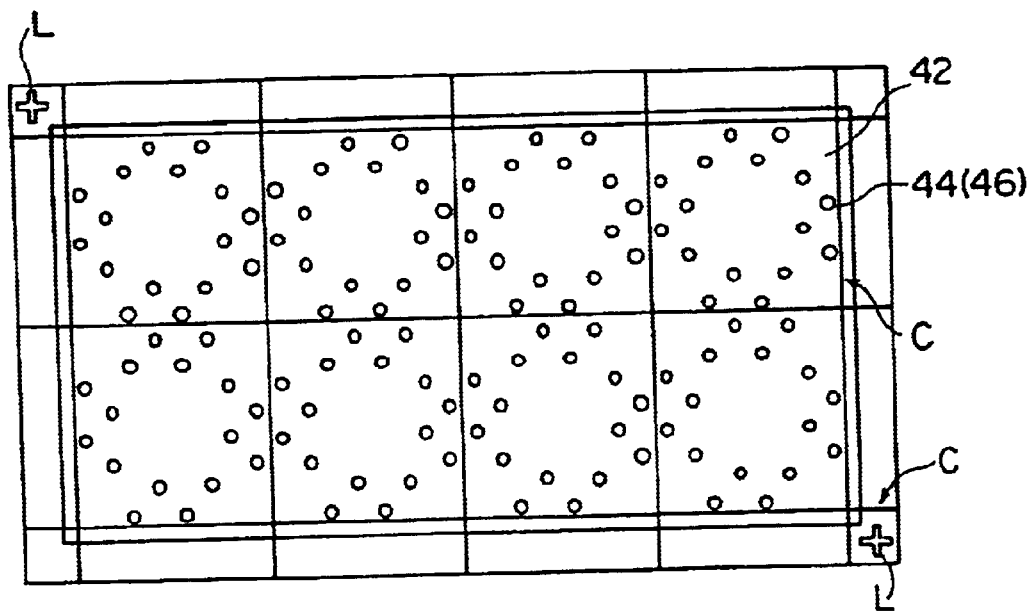
FIG. 14 is a plan view of the semiconductor package for three-dimensional mounting illustrated in FIG. 12 in which a resist layer, resist openings, and an upper electrode are formed.
Figure 15:
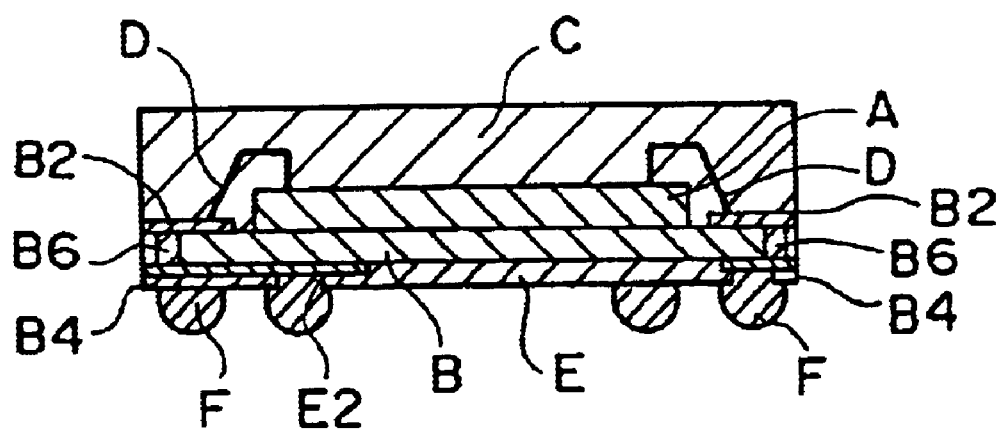
FIG. 15 is a sectional view, in a thickness direction, of an example of a conventional BGA (ball grid array) type semiconductor package.

Once the fourth wiring pattern 40 is formed, as illustrated in FIG. 14, the resist layer 42 of photoresist resin is formed on the entire surface of the sealing resin layer 6, and the resist openings 44 are formed at the resist layer 42 by photolithography.

After the resist openings 44 have been formed, with the resist layer 42 serving as a mask, the surface of the fourth wiring pattern 40 exposed at the resist openings 44 is plated with nickel so that the nickel layer 46A is formed. Subsequently, the surface of the nickel layer 46A is plated with gold so that the gold layer 46B is formed. In this way, the upper electrodes 46 are formed.

When the upper electrodes 46 are formed by solder, solder paste may be applied into the resist openings 44, and subsequently, the solder in the paste may be melted.

Finally, the wiring substrate 4 on which the upper electrodes 46 are formed is cut in a grid-like pattern along the cutting lines C by using a dicing plate or the like. As a result, the semiconductor packages 106 for three-dimensional mounting are obtained.

In the semiconductor package 106 for three-dimensional mounting as well, the fourth wiring pattern 42 may be different from the first wiring pattern 8 and the second wiring pattern 10. Therefore, the resist openings 44 can also be provided above the semiconductor chip 2, and need not be necessarily located directly above the openings 22 and the upper connecting surfaces 18 at the wiring substrate 4.

Accordingly, when a semiconductor package for three-dimensional mounting, which has a semiconductor chip different from the semiconductor chip 2 of the semiconductor package 106 for three-dimensional mounting, is placed on the semiconductor package 106 for three-dimensional mounting, it is sufficient if the fourth wiring pattern is appropriately selected so that the positions of the resist openings 44 correspond to the positions of the openings 22 of the semiconductor package for three-dimensional mounting which is to be placed on the semiconductor package 106.

Therefore, as in the case with the semiconductor package for three-dimensional mounting according to the second embodiment, system-on-chip mounting can be carried out on the semiconductor package 106 for three-dimensional mounting as well, with no mother board being interposed therebetween.

Further, as for the semiconductor package 106 for three-dimensional mounting, since the fourth wiring pattern is directly formed on the surface of the sealing resin layer 6, the semiconductor package 106 for three-dimensional mounting can be made thinner than the semiconductor package for three-dimensional mounting according to the second embodiment by an amount corresponding to the rewiring substrate.

Accordingly, the semiconductor package 106 for three-dimensional mounting is more preferable, than the semiconductor package for three-dimensional mounting according to the second embodiment, as a semiconductor package for a cellular phone in which the mounting area is strictly limited and for equipment in which high-speed operation is required.

What is claimed is:

1. A semiconductor package for three-dimensional mounting, comprising:

a first substrate having an upper surface on which a first metal pattern is formed and a lower surface on which a second metal pattern is formed, said first metal pattern and second metal pattern being electrically connected to each other;

a semiconductor chip which is placed on the upper surface of the first substrate and Is electrically connected to the first metal pattern;

a sealing resin layer which is formed on the upper surface of the first substrate and seals the semiconductor chip and the first metal pattern;

a conductive wire which passes through the resin layer and has one end electrically connected to the first metal pattern and the other end exposed at a top surface of the resin layer, the exposed other end of said conductive wire and the top surface of the resin layer being substantially level with each other, the exposed other end of said conductive wire being adapted to receive a first solder ball directly thereon;

a first electrode which is formed on the lower surface of the first substrate and is electrically connected to the second metal pattern; and a second solder ball directly bonded to said first electrode wherein when the first solder ball is received on the exposed other end of said conductive wire, the first solder ball will be disposed in alignment with said second solder ball, and said second solder ball will be electrically connected to the first solder ball, thereby allowing said first substrate to be connected to another substrate, with said first substrate having a same orientation as the another substrate.

2. A semiconductor package according to claim 1, further comprising a second substrate placed over the surface of the resin layer, having an upper surface and a lower surface opposite the upper surface, wherein the second substrate includes a third metal pattern which is electrically connected to the other end of the conductive wire from the lower surface of the second substrate, and a second electrode which Is formed on the upper surface of the second substrate and is electrically connected to the third metal pattern.

3. A semiconductor package according to claim 2, wherein a solder ball is bonded to the second electrode at the second substrate.

4. A semiconductor package according to claim 2, wherein the first electrode and the second electrode are disposed at different positions in horizontal directions.

5. A Semiconductor package according to claim 4, wherein a second semiconductor chip is stacked on the upper surface of the second substrate, the second semiconductor chip being electrically connected to the second electrode and having a function different from that of the semiconductor chip.

6. A semiconductor device in which the semiconductor package for three dimensional mounting of claim 1 is mounted on a mother board.

7. A semiconductor device in which a plurality of semiconductor packages of claim 1 are stacked.

8. A semiconductor device according to claim 7, wherein semiconductor chips of the semiconductor packages of the plurality of semiconductor packages, comprise memory elements.

9. A semiconductor package for three-dimensional mounting, comprising:
- a first substrate having an upper surface on which a first metal pattern is formed and a lower surface on which a second metal pattern is formed, said first metal pattern and second metal pattern being electrically connected to each other;
- a semiconductor chip which is placed on the upper surface of the first substrate and is electrically connected to the first metal pattern;
- a sealing resin layer which is formed on the upper surface of the first substrate and seals the semiconductor chip and the first metal pattern;
- a conductive wire which passes through the resin layer and has one end electrically connected to the first metal pattern and the other end exposed at a top surface of the resin layer, the exposed other end of said conductive wire and the top surface of the resin layer being substantially level with each other;
- a first electrode which is formed on the lower surface of the first substrate and is electrically connected to the second metal pattern;
- a wiring pattern formed over the sealing resin layer and being electrically connected to the conductive wire, said wiring pattern being comprised of at least a first wiring and a second wiring, said first wiring being disposed closer to a center of the semiconductor package than said second wiring is, and said second wiring being disposed closer toward a periphery of the semiconductor package than said first wiring is, wherein said wiring pattern comprises a plurality of said first wirings, and a plurality of said second wirings, said first wirings and said second wirings being alternatingly arranged.

10. A semiconductor package for three-dimensional mounting, comprising:
- a first substrate having an upper surface on which a first metal pattern is formed and a lower surface on which a second metal pattern is formed, said first metal pattern and second metal pattern being electrically connected to each other;
- a semiconductor chip which is placed on the upper surface of the first substrate and is electrically connected to the first metal pattern;
- a sealing resin layer which is formed on the upper surface of the first substrate and seals the semiconductor chip and the first metal pattern;
- a conductive wire which passes through the resin layer and has one end electrically connected to the first metal pattern and the other end exposed at a top surface of the resin layer, the exposed other end of said conductive wire and the top surface of the resin layer being substantially level with each other;
- a first electrode which is formed on the lower surface of the first substrate and is electrically connected to the second metal pattern;
- a wiring pattern formed over the sealing resin layer and being electrically connected to the conductive wire, said wiring pattern being comprised of Cu; and
- a second electrode formed on the wiring pattern, the second electrode including an Ni layer in electrical connection with the wiring pattern, and an Au layer disposed on the Ni layer.

* * * * *